United States Patent [19]

Rausch

[11] Patent Number: 4,542,337

[45] Date of Patent: Sep. 17, 1985

[54] ELECTRO-MECHANICAL ANTI-TAMPERING DEVICE FOR ELECTRIC METERS

[75] Inventor: Roger A. Rausch, Plymouth, Minn.

[73] Assignee: Honeywell Inc., Minneapolis, Minn.

[21] Appl. No.: 429,345

[22] Filed: Sep. 30, 1982

[51] Int. Cl.[4] ............................................. G01R 1/00
[52] U.S. Cl. .................................. 324/110; 340/566; 340/568
[58] Field of Search ....................... 324/110, 156, 157; 200/52, 61.81, 51.1; 340/635, 541, 571, 568, 637, 687, 566; 361/364–371

[56] References Cited

U.S. PATENT DOCUMENTS

| 846,624 | 3/1907 | Saunders | 324/110 |
|---|---|---|---|
| 2,056,494 | 10/1936 | Tucker, Jr. et al. | 200/52 |
| 3,962,696 | 6/1976 | Smith | 340/566 |
| 4,039,943 | 8/1977 | Tapscott | 324/110 |
| 4,150,371 | 4/1979 | Scaglione | 324/110 |
| 4,297,683 | 10/1981 | Roberts | 340/568 |

*Primary Examiner*—Michael J. Tokar
*Attorney, Agent, or Firm*—Charles G. Mersereau

[57] ABSTRACT

An apparatus for indicating electric meter tamper is disclosed having a switch provided with normally closed contacts in the nature of an enclosed race having a central inner contact and a plurality of spaced outer contacts operating in conjunction with a conductive, magnetic ball disposed in the race such that when the ball is in a stable position one of the outer contacts is electrically connected to the center contact and when the ball is disturbed from a stable position the circuit is temporarily opened. The system further includes an actuator device responsive to the opening of the normally closed contacts and an indicator device responsive to the actuator device to indicate the opening of contacts which marks the meter or otherwise signals a tampering incident. Thus, the system is sensitive to changes in position of the meter, vibration and/or magnetic fields, which are sufficient to cause said contacts to temporarily open.

9 Claims, 4 Drawing Figures

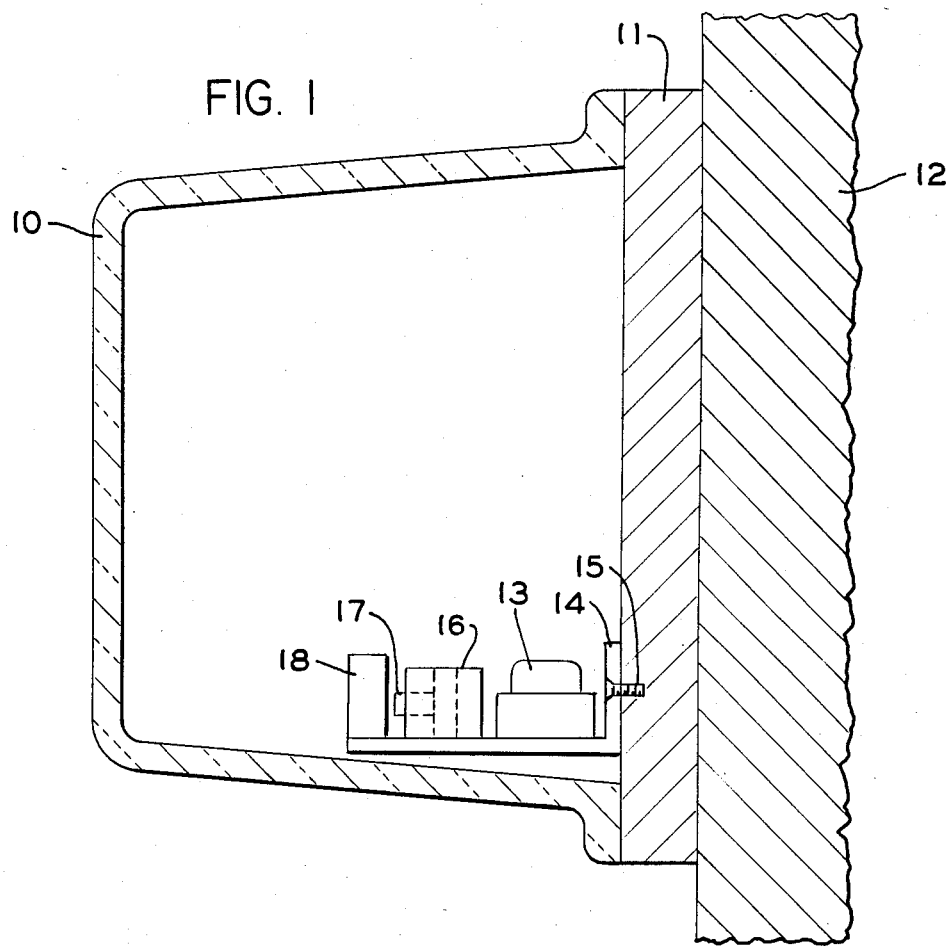
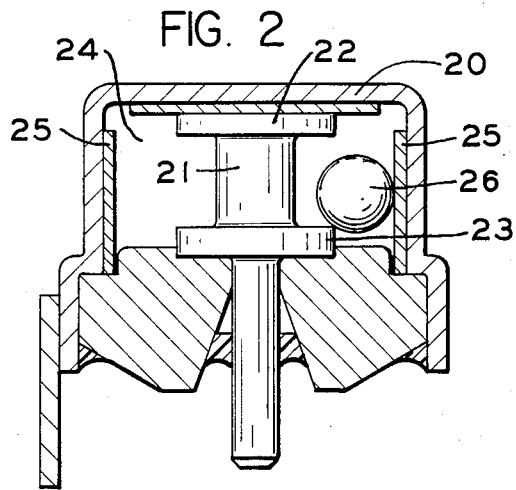
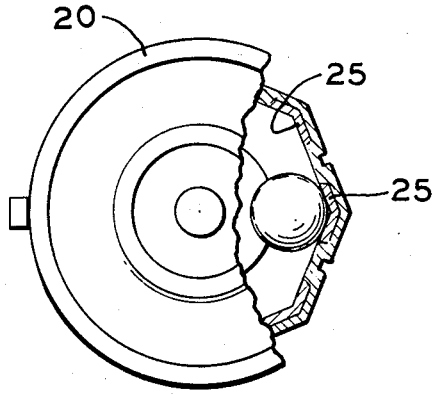

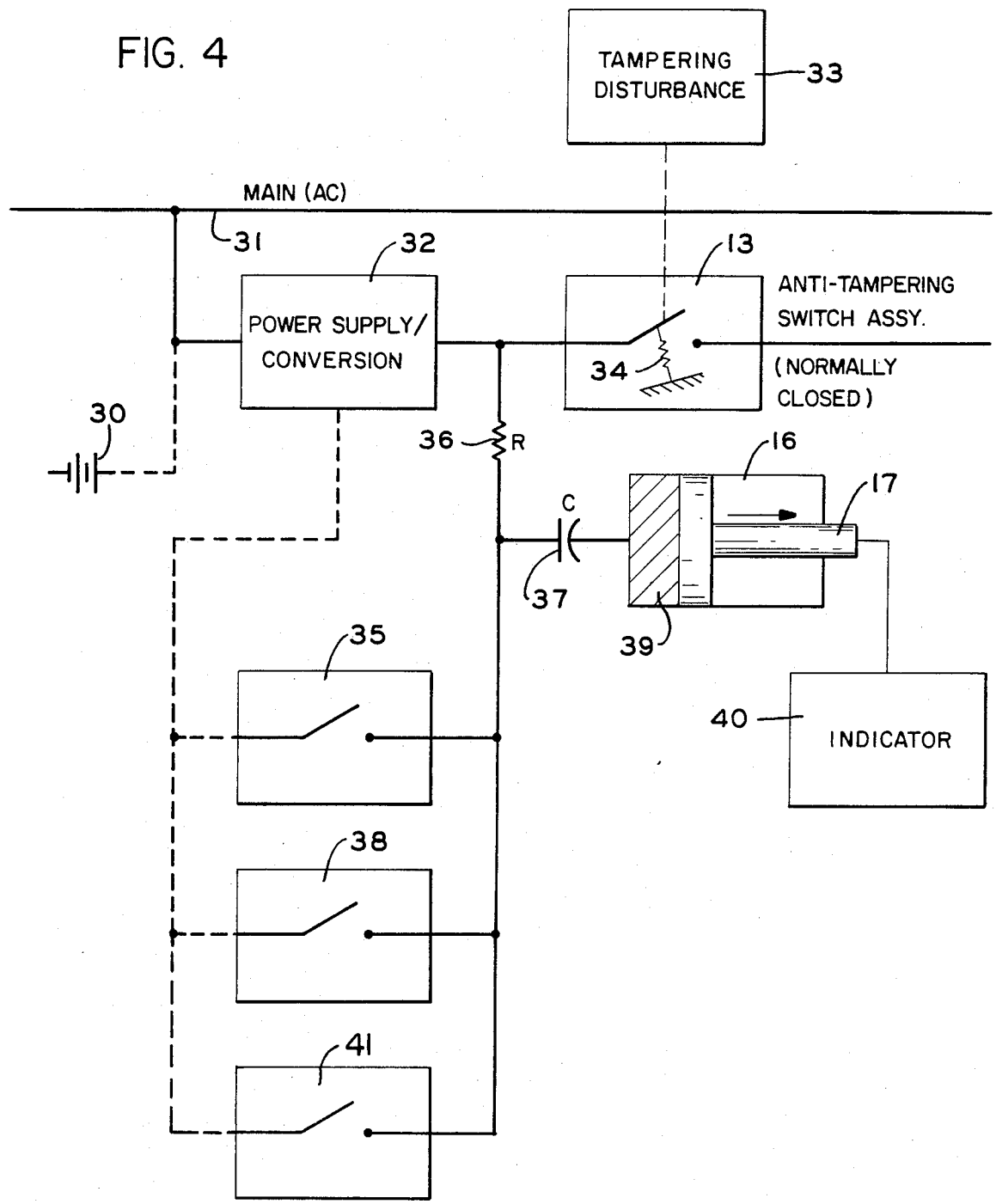

ELECTRO-MECHANICAL ANTI-TAMPERING DEVICE FOR ELECTRIC METERS

BACKGROUND OF THE INVENTION

1. Field of the Invention

The present invention relates generally to the field of devices for preventing or detecting tampering with electric watthour meters and, in particular, to an electro-mechanical anti-tampering device which utilizes a sensitive normally-closed electrical switch to actuate a mechanical or other device to respond to several types of attempted tampering.

2. Description of the Prior Art

The use of induction type watthour meters installed in meter sockets at customers' sites is well known in the electric utility metering field. Total electrical energy consumption is indicated on one or more register dials on the watthour meter which are driven by a geared disk which, in turn, is driven by a shunt induction motor. This system continually increments the dial or dials to show total electrical energy use. The dial or dials are read periodically for the purposes of billing by utility companies. Thus, the dial on the electric watthour meter is normally the only check which the utility company has pertaining to the total electric energy consumption by a particular customer. This had led to wide-spread tampering of watthour meters in an effort to reduce the indicated consumption and thereby defraud the utility company through indication of less-than-actual power consumption. The Edison Electric Institute (EEI) estimates that the total United States utility industry loses more than four hundred million dollars annually to meter cheaters. Other estimates by utility experts run as high as two billion dollars annually.

A large share of the meter tampering is done by residential and commercial customers with single phase induction watthour meters. Of the more than twenty-five commonly detected methods of meter tampering, more than two-thirds of these require either removal of the meter from its socket or removal of the cover glass.

One well known method of meter tampering which involves removal of the meter from its socket and reinstallation of the meter in an upside down position so that the terminals are reversed and the meter registers are caused to run in reverse, thereby reducing the total indicated power consumption without interruption of the power supply to the user. Other popular methods include delivering a blow to the meter such that the induction drive system is permanently disturbed and the mechanism runs at a slower rate for a given amount of power throughput, and using an external magnet to slow or even stop the operation of the induction disk drive system. In some cases the glass is removed and the dial readings changed or the operation of the mechanism otherwise interfered with to affect the meter reading. In a publication entitled "Meter Tampering Report" published in June 1978 by Texas Electric Cooperatives, Inc. it is estimated that the above overt methods account for about 85% of the total meter tamperings. Other, more subtle, methods account for the remainder.

One clever prior art approach to the problem associated with reinserting the meter upside down is disclosed in U.S. Pat. No. 4,039,943 issued Aug. 2, 1977. If the meter is equipped with a gravity switch which together with an auxiliary magnet cooperates not only to cause the meter to operate in the forward direction when installed upside down, but also causes it to run at a greater rate than that indicated by the actual power consumed, thereby penalizing the defrauder.

Ball-type normally-closed switch devices have been used in the prior art to open shunt circuits and take electric meters completely out of service such as that shown in U.S. Pat. No. 846,624 issued Mar. 12, 1907 to W. L. Saunders. While tampering in the case of that meter may temporarily take the meter out of service, replacement of the meter will put it back into service without any further indication of tampering. There remains a need for a low-cost, sensitive device which can be retrofitted into existing meters and which will readily detect the most common types of meter tampering.

SUMMARY OF THE INVENTION

By means of the present invention, there is provided an electro-mechanical tamper indicating or warning device which will detect movement of the cover or meter, any excessive vibration or impact or the presence of an externally applied magnetic field. A metallic ball is mounted in a torroidal shaped run having at least one inner and a plurality of outer contacts such that the ball in any one of a multiplicity of stable positions around the center post bridges the center post contact and one of the contacts along the outer circumference of the torroidal switch. In this manner the switch is normally closed and any disturbance that causes motion of the ball will at least momentarily open the switch as the ball moves off of the particular outer contact against which it has come to rest. Thus, any disturbance of the meter which causes motion of the ball will open the switch. By making the ball of a magnetic material, the presence of a magnetic field also will cause the motion of the ball and trigger the switch opening.

The anti-tampering switch of the invention can be used to trigger a servo system which might include a microminiature piston actuator which may be activated by an explosive designed to deliver a linear force. The motion of the piston can be made irreversible and used to mark the tampering event by any desirable means such as a witness block. Of course, the opening of the switch may be utilized to trigger an alarm or any other device to instantaneously indicate tampering, however, the operation of the piston will provide a permanent record noticeable at the next meter reading.

The ball switch is normally mounted on the cover glass to provide better sensitivity to external events concerning the meter. The switch can be connected electrically in the manner necessary utilizing power supplied by conversion from the shunt circuit running through the watthour meter itself and thereby can be retrofitted to existing meters. Similarly, the device can also be interlocked with the cover plate of the meter socket to detect tampering activities with the socket rather than the meter itself.

BRIEF DESCRIPTION OF THE DRAWINGS

In the drawings wherein like numerals are utilized to designate like parts throughout the same:

FIG. 1 is a view of a typical watthour meter, without the drive mechanism, showing the mounting of the one embodiment of the invention in the meter housing;

FIG. 2 is an enlarged, vertical section of the electric switch of FIG. 1 in accordance with the invention;

FIG. 3 is an enlarged plan view, partially in section, showing more details of the switch; and FIG. 4 is an electric block diagram showing a typical electrical hookup of the anti-tampering system of the invention.

DESCRIPTION OF THE PREFERRED EMBODIMENT

In FIG. 1 there is shown a side view of a typical single-phase induction watthour meter. The meter is shown without the internal mechanism to more conveniently depict the anti-tampering device in accordance with the present invention. The meter includes a heavy glass cover 10 attached to a mechanism support member 11 which, in turn, plugs electrically into a permanently mounted base member or socket 12 utilizing a multiple of conventional electrical blade plugs (not shown) in a well known fashion. The anti-tampering device of the invention is depicted through the transparent glass cover 10 and includes the anti-tampering switch 13 which may be mounted on a member 14 as by screws 15. The microminiature piston actuator 16 having a piston 17 and a witness block or other indicator 18 are also provided.

As is more clearly shown in FIGS. 2 and 3, the anti-tampering switch 13 further includes an outer housing 20 and a cylindrical center member 21 having hublike, shoulder members 22 and 23 is provided which, together with the outer cover 20 define a hollow internal torroidal shaped chamber 24 in the form of a ball race. The outer surface of the hubs 22 and 23 is made conductive. The switch mechanism further includes a series of electrically conducting outer contacts 25 spaced about the periphery of the cover 20. A conducting ball of a magnetic material 26 is provided in the space 24 such that when the ball is at rest in any position one of the contacts 25 is electrically connected via either hub 22 or 23. In this manner the switch is normally closed when the system is stable. The outer contacts 25 are spaced apart such that the ball 26 cannot contact more than one of them at a time. This assures that the switch will open when the ball shifts from one outer contact to another. The conducting members 25 are preferably made wedge-shaped such that the ball will stabilize in the position in contact with one of these members.

A typical electrical block diagram together with the more detailed diagram of the piston actuator in accordance with the invention is shown in FIG. 4. Thus, the required power supply may be DC as represented by a battery 30 or AC. In either case the power may more advantageously be derived from the main AC line 31 into which the meter is conventionally plugged utilizing any compatible power supply conversion system as depicted at 32 in a well known fashion. The anti-tampering switch 13 is shown in block form and is designed to be responsive to any one or more of several tampering disturbances which may temporarily dislodge the element 26 as is shown at 33. The spring 34, of course, is utilized to depict the gravity effect on the element or ball in the ball race which would present a normally closed situation. Upon opening of the switch 13 the piston actuator is triggered by the diversion of power through the RC circuit including resistor 36 and capacitor 37. Additional types of disturbances can be integrated into the system if desired through switches 35 and 41. For example, switch 35 could be closed by the presence of a high frequency AC signal. Similarly switch 41 could be closed by the addition of a DC load to the internal circuits of the meter. The additional switch 38 may be used to operate an alarm, transmit a signal to the power company indicating tampering or to operate any other device desired.

The piston actuator 16 with piston 17 may be utilized together with an explosive charge as at 39 which drives the piston 17 outward of the cylinder at an indication of tampering. This may be used to blast a hole in the witness block 18, discolor the witness block as by having a piston of a color different from that of the block, or by using any other desired means to readily indicate that the meter has been affected. For example, the indicator as depicted at 40 may consist of a shear pin, brittle vial which breaks spilling a colored liquid, flag or any other readily visible means to show the meter has in fact suffered some kind of external interference which would cause the contact to open.

In operation, after the meter has been installed with the anti-tampering system of the invention, conditions are allowed to stabilize for a predetermined period of time before the circuit arms itself as by utilizing a conventional delay system in the electrical circuit. The metallic, magnetic ball then will be at rest in any one of several stable positions around the post. In this position the ball bridges the center contact with one of the contacts along the outer periphery of the switch. In this manner, the switch is normally closed and any disturbance which causes the motion of or dislodges the ball opens the switch. For example, tilting the assembly causes the ball to roll to the lowest point opening and closing the switch one or more times in succession. Similarly the presence of a sufficient magnetic field causes motion of the ball from one contact to another and triggers a switch opening as does a blow to the meter case. Of course, the device is sensitive and readily responds to the removal of the meter from the socket or removal of the glass cover and to any excessive vibration or external impact to the device.

The sensitivity of the ball switch can be made extremely high. Switches of this nature also may be made extremely small and lightweight and are highly reliable. These devices may be as small as 0.6 inch long by 0.1 inch in diameter. Therefore, the switch can easily be tailored to respond to any disturbance threshold.

The device can readily be installed or retrofitted into existing meters as by drilling, tapping and installing utilizing screws 15 and making a couple of simple electrical attachments into the meter itself. Thus, by means of the present invention there is presented an inexpensive, highly sensitive, retrofittable meter tampering indicator which is sensitive to the most common methods of tampering with electric meters.

While the present invention has been specifically described with respect to the detection and recording of attempts to tamper with watthour meters, it will be readily apparent to those skilled in the art that the invention can be applied to other types of metering devices which have detachable covers, are motor driven, etc. Of course the device can also be mounted directly on the meter base to prevent methods of tampering involving only the base of the meter.

The embodiments of the invention in which an exclusive property or right is claimed are defined as follows:

1. An apparatus for indicating electric meter tampering comprising:
   switch means positioned in said meter, said switch means including normally closed contact means, the closed status of which is sensitive to external disturbances to said meter, said disturbances causing said contact means to temporarily open, and wherein said contact means further comprises, an enclosed race having a central inner contact and a plurality of spaced outer contacts; and an electrically conductive, follower element disposed in and free to move around said race and which comes to rest in any stable position as dictated by gravity such that in any such stable position one of said outer contacts is electrically connected to said center contact via said follower element and when said element is disturbed from any such stable position the circuit is temporarily opened;

actuator means responsive to the opening of said normally closed contact means;

indicator means responsive to said actuator means to indicate the opening of said contact means.

2. The apparatus of claim 1 wherein said follower element is a ball.

3. The apparatus of either one of claims 1 or 2 wherein said contact means opens when said switch is subjected to any change in position, vibration or impact shock above a desired threshold.

4. The apparatus of claim 1 wherein said follower element is magnetic and said contacts are caused to open upon the presence of a magnetic field having a strength above a given threshold.

5. The apparatus of either of claims 1 or 2 wherein said indicator means further comprises a piston means further driven in response to said actuator means outward from a piston block to indicate opening of said contact means.

6. The apparatus of claim 5 wherein said indicating means further comprises witness block means puncturable by said piston means to indicate opening of said contact means.

7. The apparatus of claim to any one of claims 1, 2 or 4 wherein said switch means is mounted on the inside of the cover glass of a watthour meter.

8. The apparatus of any one of claims 1, 2 or 4 wherein said switch means is mounted on the base of a watthour meter.

9. The apparatus according to either one of claims 1 or 2 wherein said indicator means is an electrically connected remote output.

* * * * *